United States Patent
Göser et al.

(10) Patent No.: US 6,232,781 B1
(45) Date of Patent: May 15, 2001

(54) FALSE-CLOSURE DETECTION DEVICE FOR ELECTRICAL CONSUMERS

(75) Inventors: Gerhard Göser, Tournefeuille (FR); Andrea Hinterwimmer, Donaustauf (DE); Volker Karrer; Dieter Sass, both of Regensburg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/090,562

(22) Filed: Jun. 4, 1998

(30) Foreign Application Priority Data

Jun. 4, 1997 (DE) .................................. 197 23 456

(51) Int. Cl.⁷ .......................... G01R 31/02; G08B 21/00
(52) U.S. Cl. ..................... 324/422; 324/418; 324/415; 340/644; 340/650
(58) Field of Search ...................... 324/415, 418, 324/422; 340/644, 650; 361/7

(56) References Cited

U.S. PATENT DOCUMENTS

| 4,420,784 | * | 12/1983 | Chen et al. ........................ 361/7 |
| 4,932,246 | * | 6/1990 | Deutsch et al. ................... 73/119 A |
| 5,304,935 | * | 4/1994 | Rathke et al. ..................... 324/415 |

FOREIGN PATENT DOCUMENTS

| 3842426A1 | 6/1990 | (DE) . |
| 4030533A1 | 4/1992 | (DE) . |
| 4403375A1 | 9/1994 | (DE) . |
| 19526435A1 | 12/1996 | (DE) . |
| 19524615A1 | 1/1997 | (DE) . |
| 0055816A1 | 12/1980 | (EP) . |

OTHER PUBLICATIONS

"Direkter Relais–Ersatz", Walter Bucksch et al., Elektronik, Jun. 1993, pp. 86–90.

* cited by examiner

Primary Examiner—Glenn W. Brown
Assistant Examiner—Anjan K Deb
(74) Attorney, Agent, or Firm—Herbert L. Lerner; Laurence A. Greenberg; Werner H. Stemer

(57) ABSTRACT

Electrical consumers receive load current from a supply voltage via two or more power switches. A false-closure detection device includes a measuring device and a diagnostic device for the detection of faults. The measuring device is connected parallel to the power switches and the electrical consumer lying in series with the switches. A diagnostic voltage is compared as the output signal of the measuring device with a reference value for the detection of false closures in the load circuit.

25 Claims, 4 Drawing Sheets

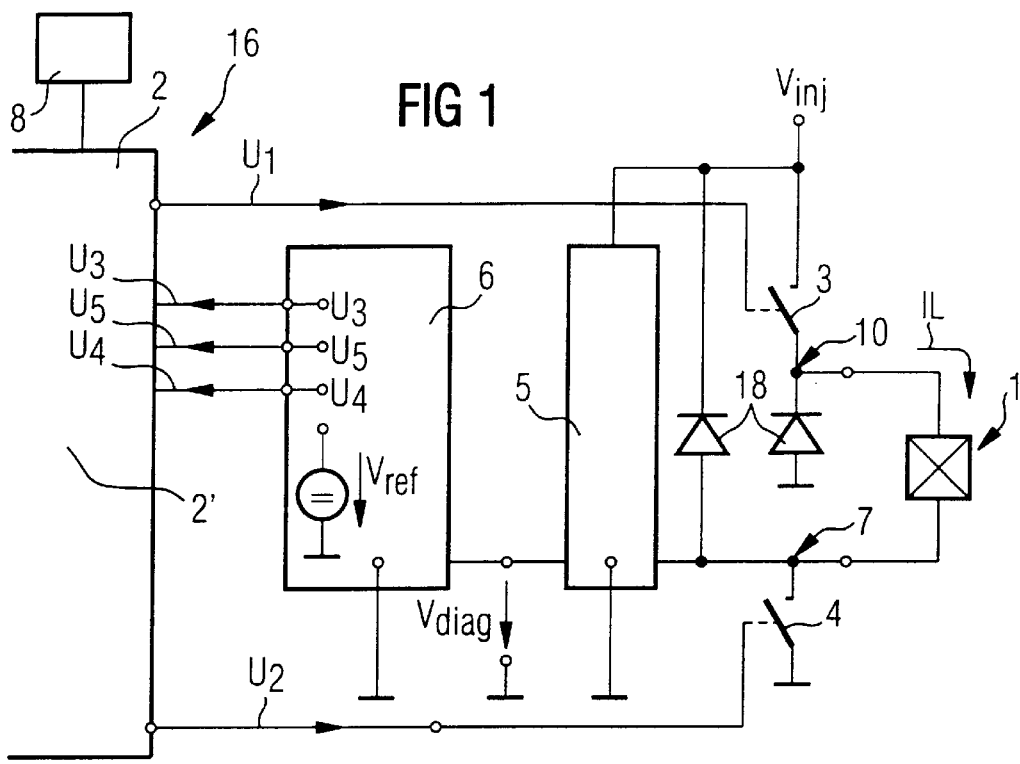
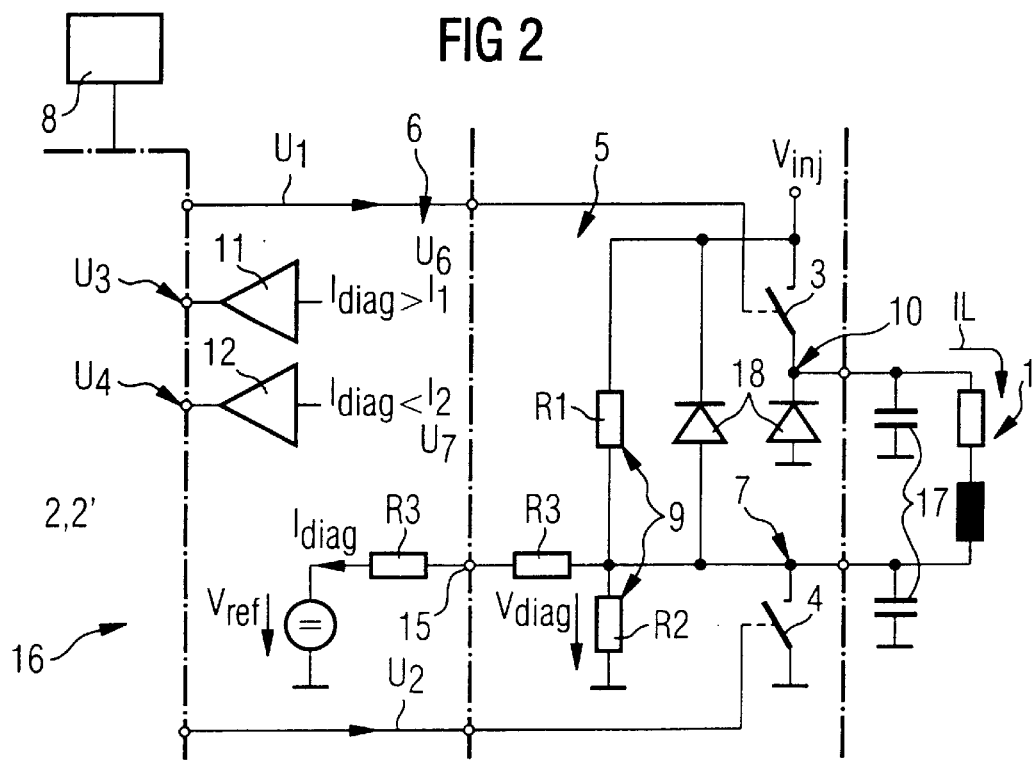

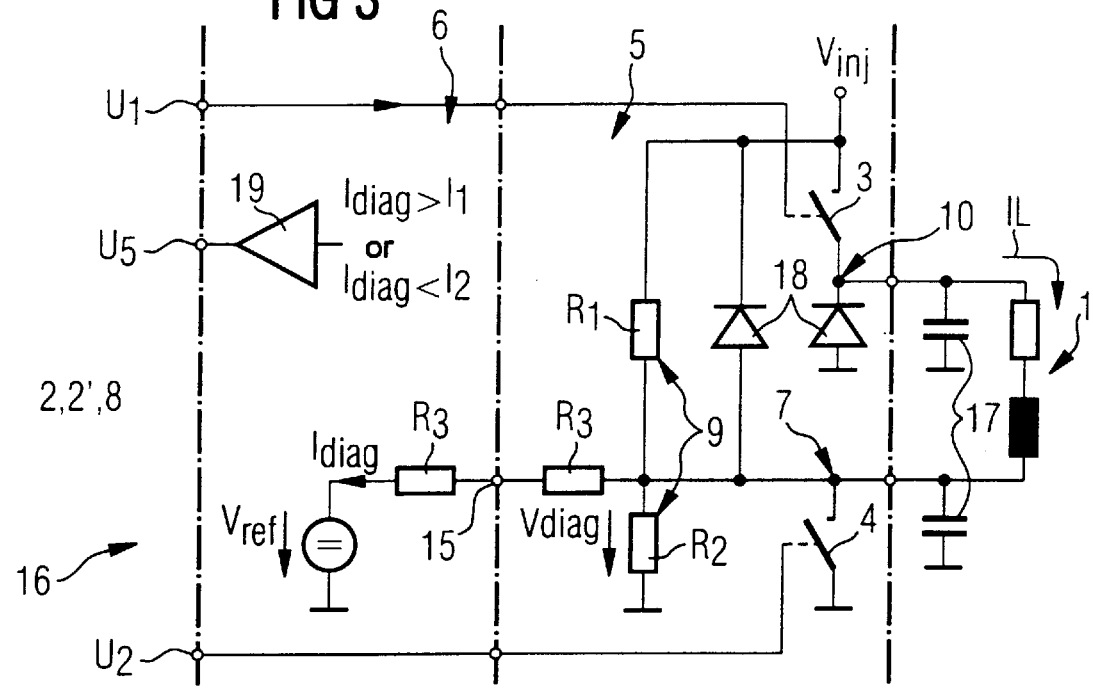
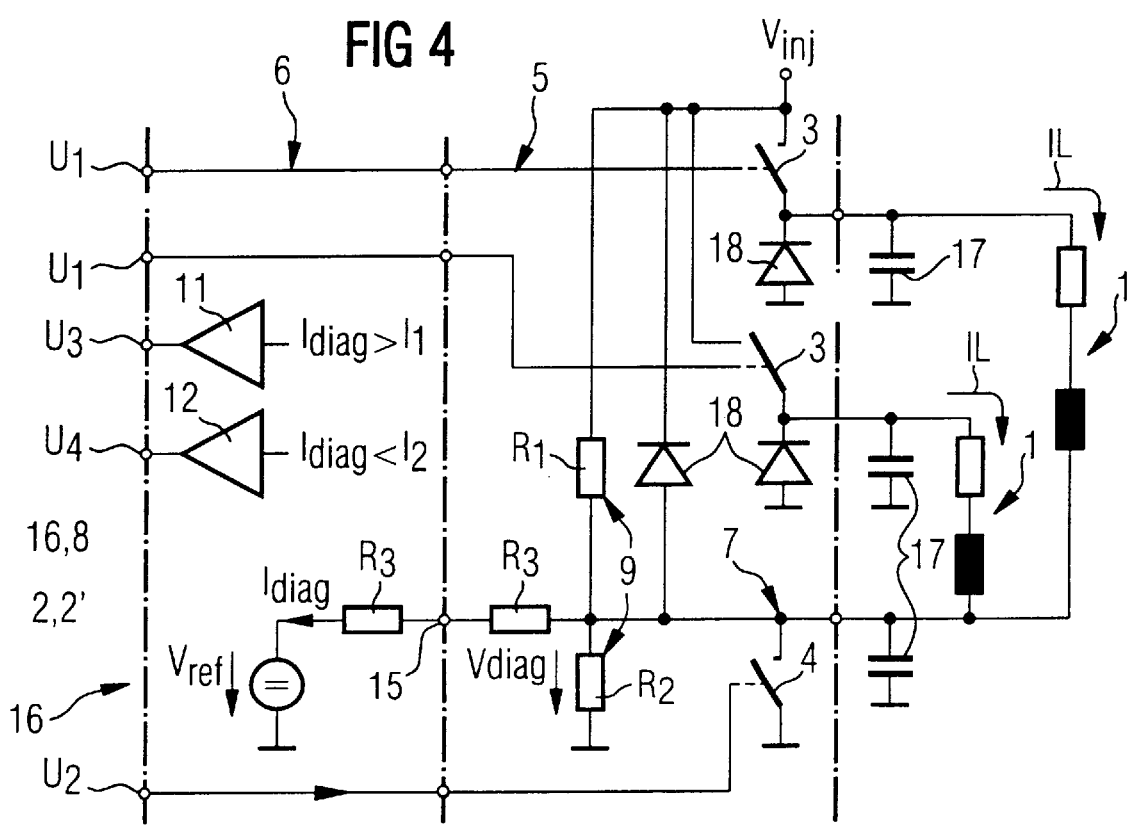

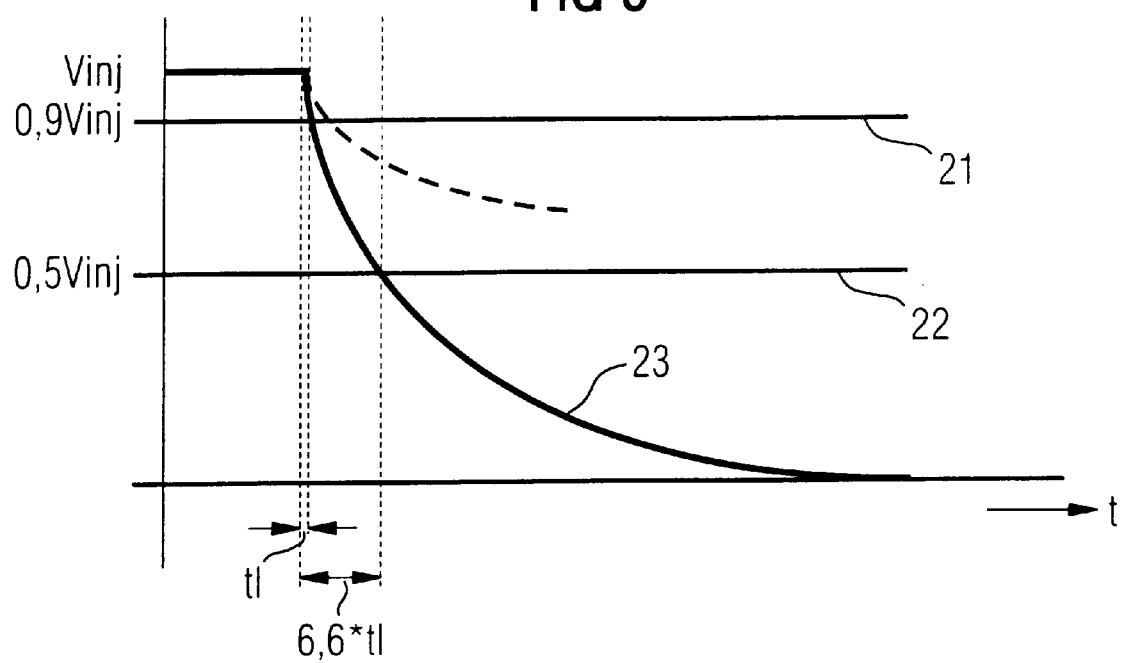
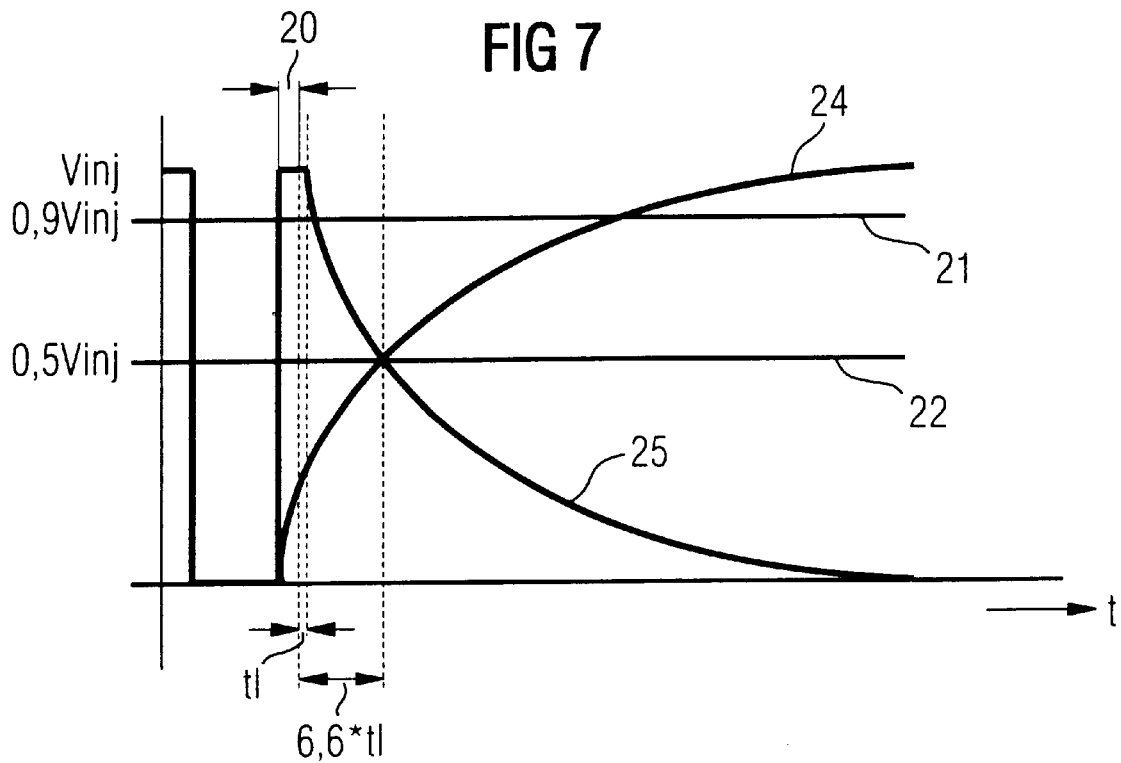

FALSE-CLOSURE DETECTION DEVICE FOR ELECTRICAL CONSUMERS

BACKGROUND OF THE INVENTION

1. Field of the Invention

The invention relates to a false-closure detection device for electrical consumers which receive load current from a supply voltage via a power output stage having at least two power switches activated by a control device with control signals, a high-side switch and a low-side switch and which form a load circuit; the system includes a measurement and diagnostic device for the detection of faults.

Devices of the generic type serve for the detection of faults in a load circuit of an electrical consumer which is overloaded or has false closures to ground or to a supply voltage.

2. Description of the Related Art

German published, non-prosecuted application DE 40 30 533 A1 discloses a system for monitoring a consumer in connection with an internal combustion engine or a motor vehicle. The consumer, in particular an electric drive which is activated by means of a bridge circuit output stage, is monitored and a delayed alarm signal is generated by comparing potentials in the region of the consumer or the output stage with predetermined threshold values derived from normal operation. The time delay depends on the magnitude of the control signal.

In that configuration there is provided a measuring path which lies directly parallel to the electrical consumer in the load branch, the output signals of which are evaluated by means of comparator stages. The consumer in that case lies in the bridging branch of a bridge formed by power-circuit position switches.

German published, non-prosecuted application DE 44 03 375 A1 discloses a device and a method for controlling an inductive consumer. There, an inductive consumer with switches arranged in an H-bridge is controlled. For monitoring the device, the H-bridge is briefly switched off. As a result, there is induced at the terminals of the consumer a voltage which is opposed to the bridge cross voltage of the switched-on state. The voltage drop across the consumer is compared with a setpoint value and an error signal is triggered if there is any deviation from the setpoint value.

In that prior art device, the measured value is picked off parallel to the electrical consumer in the bridging branch and it is evaluated by means of comparators.

German published, non-prosecuted application DE 38 42 426 A1 discloses a circuit configuration for controlling and monitoring a consumer in a bridge circuit. That circuit configuration controls and monitors an electrical consumer in the diagonal of a bridge circuit comprising four FET power-switching elements. The circuit configuration is used to monitor the overloading of the circuit of the consumer, which is switched off temporarily or until the fault is rectified.

In that prior art circuit configuration, the measuring path lies parallel to the electrical consumer in the bridging branch of the bridge.

European patent application EP 0 055 816 discloses an electronic circuit with power switches in bridge arrangement, an inductive consumer lying in the bridging branch. The voltage across the bridging branch is evaluated for measuring and evaluation purposes in a downstream evaluation circuit.

In the publication "Elektronik", vol. 13, 1993, pages 86–90, there is disclosed a circuit which involves a monolithic H-bridge driver with protective and diagnostic circuits. Represented in FIG. 1 of the publication there is shown a motor as the electrical consumer in the load circuit. The load current of the motor is controlled in two directions. By means of relays and for diagnostic or measuring purposes, the bridging branch, or the voltages of the terminals of the electrical consumer, is or are interrogated and measured. The measuring device senses the "dangerous state" and evaluates it and precautions for the activation of the power switches are taken by means of a control stage. For diagnostics, the evaluated measuring signals are externalized by means of suitable buffer circuits and excess temperature, overcurrent, consumer interruption and undervoltage can be read off at the status output. By suspending the time delay of the temperature hysteresis and by skillful sequencing when interrogating the input signals, it is additionally possible to distinguish between a short circuit of output 1 or 2 to ground and $U_{bat}$.

The above-mentioned publications have in common that the measuring voltage for an electrical consumer operated in an H-bridge is picked off directly at the electrical consumer and evaluated by means of suitable circuits, generally comparator circuits. As a result, certain operating faults can be sensed and evaluated and precautions can be taken by means of control circuits to ensure that the fault does not lead to appreciable consequences.

It is a common disadvantage of all those prior art configurations that a defect at the power-circuit position switches themselves cannot be detected and evaluated, or only to a limited extent.

SUMMARY OF THE INVENTION

It is accordingly an object of the invention to provide a fault connection detection device for electrical consumers, which overcomes the above-mentioned disadvantages of the prior art devices and methods of this general type and by which both false closures which are caused by the electrical consumer and false closures which result from the power-circuit position switches can be detected, localized, evaluated and displayed.

With the foregoing and other objects in view there is provided, in accordance with the invention, a false-closure detection device for an electrical consumer receiving a load current from a supply voltage via a power output stage, the power output stage having at least two power switches and a control device outputting control signals for controlling the power switches, the power switches including a high-side switch and a low-side switch which, together with the consumer, form a load circuit, the false-closure detection device comprising:

a measuring device connected in parallel with a load circuit formed by a high-side switch, a consumer, and a low-side switch, the measuring device including a voltage divider with two resistors and a tap between the two resistors, the tap being connected to one of a voltage-potential-carrying terminal of the low-side switch and a terminal of the high-side switch opposite from the supply voltage, and the tap carrying a diagnostic voltage as an output signal of the measuring device; and a diagnostic device for detecting faults connected to the measuring device and receiving the diagnostic voltage from the measuring device.

In other words, the object of the invention is satisfied in that the measuring device is connected in parallel to the power switches and the electrical consumer and in that it connects either to the voltage-potential-carrying terminal of the low-side switch or the terminal of the electrode of the high-side switch facing away from the supply voltage. The diagnostic voltage is fed as the output signal of the measuring device to the diagnostic device and compared there with a reference value for the detection of false closures in the load circuit.

In accordance with an added feature of the invention, there is provided an evaluation device connected to the diagnostic device and a display device connected to the evaluation device, the diagnostic device comparing the diagnostic voltage received from the measurement device with a reference value and outputting at least one output signal for processing in the evaluation device and for forming signals assigned to localized false closures in the load circuit and for display by the display device. In other words, at the output of the diagnostic device there are a plurality of output signals or only one output signal, which are/is processed in an evaluation device and as a consequence of which are/is detected as localizable false closures or false closure in the load circuit and are/is displayed by means of a display device.

In accordance with an additional feature of the invention, the diagnostic device comprises a current-controlled window comparator connected to receive the constant reference value and the diagnostic voltage of the measuring device.

In accordance with another feature of the invention, the current-controlled window comparator has a first input receiving two current threshold values derived from the constant reference value and a second input receiving the diagnostic voltage of the measuring device, and whereby the two current threshold values define a window region of the window comparator.

Alternatively, the diagnostic device comprises a voltage-controlled window comparator connected to receive the constant reference value and the diagnostic voltage of the measuring device. In that case, the voltage-controlled window comparator has a first input receiving two voltage threshold values derived from the constant reference value and a second input receiving the diagnostic voltage of the measuring device, and whereby the two voltage threshold values define a window region of the window comparator.

In accordance with a further feature of the invention, window comparator substantially comprising two comparators outputting output signals identical to output signals of the diagnostic device. The output signals of the two comparators of the window comparator are combined by means of a network which supplies a single output signal at the output of the diagnostic device.

In accordance with again an added feature of the invention, the control device and the evaluation device are integrated in a microcontroller unit. A plurality of parallel load circuits each having a high-side switch and an electrical consumer and having a common low-side switch are connected together.

In accordance with again an additional feature of the invention, a plurality of electrical consumers are connected in groups of mutually parallel load circuits each having a high-side switch and having a common low-side switch, each of the load circuits having a measuring device and a diagnostic device. Preferably, the system comprises a decoder activating the groups of load circuits, and a multiplexer connected to interrogate the diagnostic devices. In a preferred feature, the microcontroller outputs a group selection signal to the decoder distinguishing the individual groups from one another, and wherein control signals activating respective high-side switches are formed by the control signals of the microcontroller via the decoder and the control signals for the low-side switches are formed by means of the control signal fed to the decoder by the microcontroller, and wherein the output signal is fed to the microcontroller from the output signals of the individual groups by means of the group selection signal and the multiplexer.

In other words, the control device and the evaluation device are preferably realized by a microcontroller. The output signals or the output signal of the diagnostic device may be evaluated in the microcontroller in a form correlated or uncorrelated with the control signals, logically combined or uncombined with the control signals of the high-side and low-side switches. This advantageously produces exactly localizable fault sources, which can be indicated directly in the display device.

In accordance with again another feature of the invention, there is provided a resistor connected between the diagnostic voltage output of the measuring device and a tap carrying the reference value of the diagnostic device, the resistor conducting a diagnostic current which, depending on a magnitude of the diagnostic voltage relative to the constant reference value may be positive, zero, or negative and have substantially three different forms of state which are digitizable by the window comparator.

In accordance with again a further feature of the invention, a quiescent potential of the diagnostic voltage during a static operation (the high-side switch and the low-side switch are blocked) is adjusted in that the two resistors of the voltage divider are dimensioned such that, for ohmic or inductive electrical consumers with substantial capacitive components, a rapid response of the measuring device and the diagnostic device is assured during charge reversal of capacitances, when the power switches are dynamically reactivated.

In accordance with yet an added feature of the invention, the quiescent potential of the diagnostic voltage of the measuring device is adjusted to between 0.7 Vinj and 0.9 Vinj, wherein Vinj is the supply voltage of the consumer, preferably to 0.9 Vinj.

With the above and other objects in view there is also provided, in accordance with the invention, a method for evaluating false-closures with a false-closure detection device as outlined above. The method comprises processing the diagnostic voltage in the diagnostic device and forming at least one output signal taking into account control signals of the high-side switch and of the low-side switch.

In accordance with another mode of the invention, the signals controlling high-side switch and the low-side switch are digital control signals, and first only one of the two control signals is switched and then the other of the two control signals is switched after a time delay.

In accordance with an added feature of the invention, the method includes the steps of activating the high-side switch for a few $\mu s$ before evaluating the output signal in the evaluation device, and thereby actively charging the diagnostic potential to the supply voltage potential from any arbitrary potential without additional power drivers, and subsequently discharging the capacitive components from the supply voltage potential down to the diagnostic voltage, for instance by 0.1 supply voltage potential.

In accordance with again another feature of the invention, the electrical consumers are ohmic, inductive, or capacitive electrical consumers. They may also be substantially inductive electrical consumers with ohmic and capacitive components.

In accordance with a concomitant feature of the invention, the electrical consumers are automotive electronic components. Specifically, the invention is particularly suitable in the context of coils (inductive loads) of injection valves in automotive electronics.

Other features which are considered as characteristic for the invention are set forth in the appended claims.

Although the invention is illustrated and described herein as embodied in a false-closure detection device for electrical consumers, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a principal circuit diagram of the false-closure detection device;

FIG. 2 is a modified circuit diagram of the basic diagram of FIG. 1;

FIG. 3 is a modification of the basic diagram of FIG. 2;

FIG. 4 is a circuit diagram showing an application of a false-closure detection device with a plurality of electrical consumers and a plurality of parallel high-side switches and a single common low-side switch;

FIG. 6 is a first voltage diagram; and

FIG. 7 is a second voltage diagram.

DESCRIPTION OF THE PREFERRED EMBODIMENTS

Figure 5:
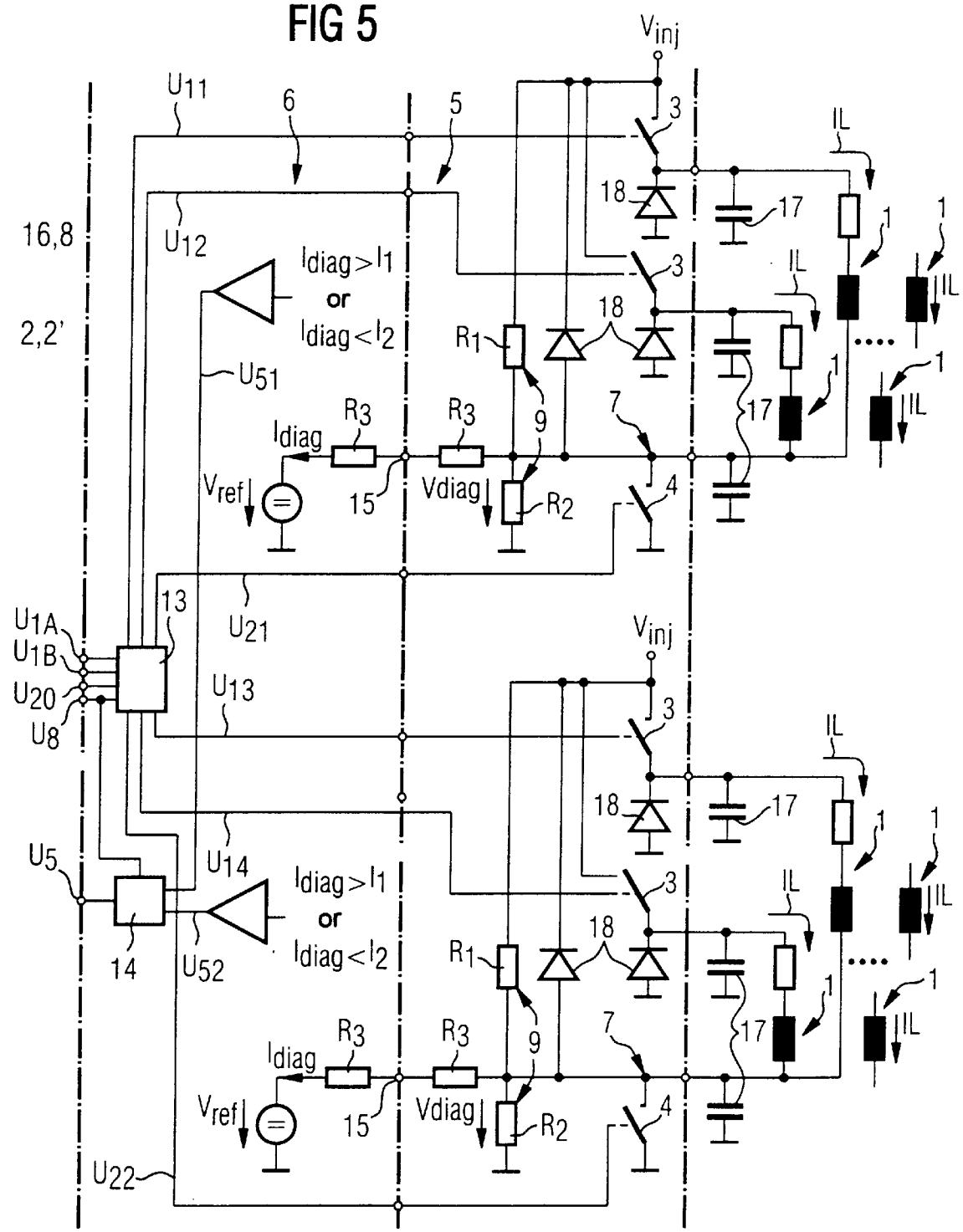
FIG. 5 is a circuit diagram showing an application of a false-closure detection device with electrical consumers interconnected into groups.

Referring now to the figures of the drawing in detail and first, particularly, to FIG. 1 thereof, there is seen a false-closure detection device, also referred to as a short circuit detector. An electrical consumer 1, i.e. a load, is activated and controlled by means of a power output stage. The power output stage comprises at least two controlled power switches, the high-side switch 3 and the low-side switch 4, which form with the electrical consumer 1 a load circuit in which there flows the load current IL to which the supply voltage Vinj is applied. The control signals U1 and U2 for the two power switches 3 and 4 are supplied by the control device 2. The high-side switch 3 is activated by means of the control device 2, with the control signal U1 and the low-side switch 4 is likewise activated by the control device 2, with the control signal U2. The measuring device 5 and the diagnostic device 6 are provided for the detection of faults.

According to the invention, the measuring device 5 is connected in parallel with the power switches 3, 4 and the electrical consumer 1 lies in series with the latter. The measuring device 5 is connected either to the voltage-potential-carrying terminal 7 of the low-side switch 4 or to the terminal 10 of the electrode of the high-side switch 3 facing away from the supply voltage Vinj.

In the embodiments of FIGS. 1 to 5, the voltage-potential-carrying terminal 7 of the low-side switch 4 is preferably used and connected to the measuring device 5.

In principle, similar distinctions between the cases of detectable false closures can also be measured and evaluated if, instead of the terminal 7, the terminal 10 of the electrode of the high-side switch 3 facing away from the supply voltage Vinj is connected.

The output signal of the measuring device 5, the diagnostic voltage Vdiag, is fed to the diagnostic device 6 and compared there with a reference value Vref for the detection of false closures in the load circuit. Depending on its modification, the diagnostic device 6 has at the output a plurality of output signals U3, U4 or only one output signal U5, which are or is processed in the evaluation device 2' and are or is determined as localizable false closures or a false closure in the load circuit. The result is displayed with the display device 8. According to the embodiment of the invention shown in FIG. 2, the measuring device 5 comprises the voltage divider 9 with the two resistors R1 and R2. The tap of the voltage divider 9 is connected to the voltage-potential-carrying terminal 7 of the low-side switch 4. The tap also carries the output signal of the measuring device 5, the diagnostic voltage Vdiag. The downstream diagnostic device 6, to which the diagnostic voltage Vdiag of the measuring device 5 is fed comprises a non-illustrated current-controlled or voltage-controlled window comparator to which on the one hand the constant reference value Vref formed by a reference device is fed and to which on the other hand the diagnostic voltage Vdiag of the measuring device 5 is fed.

In a current-controlled window comparator, two current threshold values I1 and I2 are derived from the reference value Vref. In a voltage-controlled window comparator, two voltage threshold values U6 and U7 are derived from the reference value Vref and are fed to the inputs of the window comparator. The other inputs of the window comparator receive the diagnostic voltage Vdiag or a comparable current Idiag of the measuring device 5. The threshold values I1, I2 or U6, U7 form the window region.

The threshold values I1, I2 or U6, U7 fed to the window comparator are formed such that the diagnostic voltage Vdiag or the diagnostic current Idiag of the measuring device 5 fed to the window comparator can likewise be detected at the output of the window comparator as lying above the window region, within the window region, or below the window region.

The window comparator substantially comprises the two comparators 11, 12, the output signals of which are identical to the output signals U3, U4 of the diagnostic device 6. The output signals U3, U4 of the two comparators 11, 12 of the window comparator may be connected together by means of a non-illustrated network and supply the single output signal U5 according to FIG. 3 at the output of the diagnostic device 6.

The control device 2 and the evaluation device 2' may form a unit in the form of the microcontroller 16.

The exemplary embodiment of FIG. 4 has a plurality of parallel load circuits with an electrical consumer 1 each and a high-side switch 3 each. The low-side switch 4 is common to all the electrical consumers 1.

The exemplary embodiment of FIG. 5 has a plurality of groups of parallel load circuits having a plurality of electrical consumers 1 arranged in parallel and each having a high-side switch 3 in each load circuit. Each group is made up of a common low-side switch 4 and a measuring device 5 each as well as a diagnostic device 6 each. The activation of the groups with the group selection signal U8 may take place by means of the decoder 13 and the interrogation of the diagnostic device 6 may take place by means of the multiplexer 14, controlled by the microcontroller 16.

The individual groups are distinguished from one another by means of the group selection signal U8 fed to the decoder 13 by the microcontroller 16. The control signals U11, U12, U13, U14, by which the assigned high-side switches 3 are activated, are formed by means of the control signals U1A, U1B of the microcontroller 16 via the decoder 13. The control signals U21, U22 for the assigned low-side switches 4 are formed by means of the control signal U20 fed to the decoder 13 by the microcontroller 16. The output signal US is fed to the microcontroller 16 from the output signals US, U52 of the individual groups by means of the group selection signal U8 and the multiplexer 14.

If a current-controlled window comparator is used, the diagnostic voltage Vdiag of the measuring device 5 may be combined by means of the resistor R3 and the tap 15 with the reference value Vref in the form of a constant reference voltage source of the diagnostic device 6. There flows a diagnostic current via the resistor R3 which, depending on the magnitude of the diagnostic voltage Vdiag with respect to the constant reference voltage source Vref, and according to the chosen direction of the arrow, may be positive, zero or negative and may thus have substantially three different forms of state. This can be digitized by the window comparator.

In static operation, the quiescent potential of the diagnostic voltage Vdiag of the measuring device 5 is chosen such that, when both the high-side switch 3 and the low-side switch 4 are open or blocked and the two resistors R1, R2 of the voltage divider 9 are dimensioned such that, in the case of ohmic-inductive electrical consumers 1 with relevant capacitive components, a rapid response of the measuring device 5 and diagnostic device 6 is achieved during charge reversal of the capacitances, the power switches 3, 4 are dynamically activated again. The quiescent potential of the diagnostic voltage Vdiag of the measuring device 5 is set by means of the resistors R1, R2 of the voltage divider 9 such that it lies between 0.7 Vinj and 0.9 Vinj. Preferably it is 0.9 Vinj.

The method according to the invention allows the output signals U3, U4 or the output signal U5 of the diagnostic device U6 to be evaluated by a processing program in the microcontroller 16 in a form correlated with the control signals U1, U2 of the high-side switch 3 and low-side switch 4, logically combined or uncombined. In addition, it is possible to realize this correlation or logical combination with a discrete electronic circuit, formed by hardwired hardware components.

The control signals U1, U2 of the high-side switch 3 and the low-side switch 4 are preferably digital signals. For diagnostic purposes and false-closure detection, one of the two control signals U1 or U2 alone activates the corresponding power switches 3, 4 while the other control signal U2 or U1 is switched to the relevant power switch 3, 4 after a time delay.

The false-closure detection device according to the invention preferably serves for the detection of false closures during the operation of a substantially inductive electrical consumer 1 with ohmic components and capacitive components. A preferred field of application lies in automotive electronics. In particular in the case of armature windings of injection valves as inductive electrical consumers 1 with cyclically activated power switches 3, 4 as a power output stage, this false-closure detection device can be used.

The power output stage comprising the high-side switch 3 and low-side switch 4 may be realized as an FET power transistor or bipolar transistor. The reference numeral 18 refers to freewheeling diodes.

The false-closure detection device according to the invention can be used to detect and distinguish from one another short circuits and resistive closures to the supply voltage and to ground. The diagnosis may take place even while the power output stage is without current, i.e. the high-side switch 3 and the low-side switch 4 are not simultaneously switched on for diagnostic purposes. If a plurality of electrical consumers 1 are operated by means of a common low-side switch 4, a diagnostic channel per low-side switch 4 is used. A plurality of diagnostic channels can be routed through the multiplexer 14 to a single diagnostic output and fed as output signal U5 to the microcontroller 16 if at all times only one low-side switch 4 may be active.

The diagnostic concept can also be used in principle if common high-side switches 3 are used instead of common low-side switches 4.

The operating principle of the diagnostic concept of the false-closure detection device according to the invention will now be explained with reference to the block diagram of FIGS. 1 and 2. In a preferred application, the consumer or the electrical consumer 1 may comprise the armature winding of an injection valve and the wiring harness capacitances of an injection device in a motor vehicle. The discrete power output stage includes not only the power switches in the form of the high-side switch 3 and the low-side switch 4 (MOSFETs) but also the freewheeling diodes 18 and the high-ohmic voltage divider 9 with the resistors R1 and R2 for setting the diagnostic voltage Vdiag with blocked power switches 3, 4. The diagnostic device 6 downstream of the measuring device 5 may be realized as an integrated circuit and the reference voltage source Vref with an internal resistance as well as the window comparator for measuring the diagnostic current Idiag or the diagnostic voltage Vdiag may be realized.

For the false closures distinguishable below in the false-closure detection device, reference shall be made to the basic diagram of FIG. 2, in which the diagnostic voltage Vdiag is combined with the reference voltage source Vref by means of the resistor R3.

If both power switches 3, 4 are blocked, i.e. there is no activation by the control signals U1 or U2, there is no resistive closure to the supply voltage Vinj or to ground. The reference voltage Vref and the diagnostic voltage Vdiag are approximately equal (the differences are caused by tolerances). The current thresholds I1 and I2 of the window comparator are chosen such that the diagnostic current Idiag in any event lies within the two thresholds I1, I2. If there occurs a resistive closure to the supply voltage Vinj or to ground, which has a notable influence on the mode of operation of the power output stage, the diagnostic voltage Vdiag changes distinctly. The amount of the diagnostic current Idiag increases distinctly, and the window comparator detects the type of resistive closure, depending on the operating sign of the diagnostic current Idiag.

The window comparator can also measure the diagnostic voltage Vdiag and operate with adjustable voltage threshold values U6, U7 instead of with the current thresholds I1, I2.

By correlation of the diagnostic signals in the form of the output signals U3, U4 at the output of the window comparator with the control signals U1, U2 of the power switches 3, 4, the following faults can be detected and distinguished from one another by means of the microcontroller 16:

a) Short circuit or resistive closure to the supply voltage Vinj, including a constantly conducting high-side switch 3: this false closure can be detected directly at the output of the window comparator.

b) Short circuit or resistive closure to ground, including a constantly conducting low-side switch 4: this false closure can be detected directly at the output of the window comparator.

c) No electrical consumer including a constantly blocked high-side switch 3: after closing the high-side switch 3, no closure to the supply voltage Vinj is detected.
d) Open low-side switch 4: after activating the low-side switch 4, no closure to ground is detected because the low-side switch 4 is constantly blocked.
e) High-side switch 3 and low-side switch 4 can be switched on and off only together: after closing the high-side switch 3, a closure to ground is detected instead of a closure to the supply voltage.

Special cases, which are described in the following application examples, can be derived from the principle of the diagnostic concept described above.

According to FIG. 3, the outputs of the integrated window comparator are combined with one another to form a diagnostic output with the output signal U5 at the output of the comparator 19, in order to dispense with a signal line between the diagnostic device 6 in the form of an integrated circuit and the microcontroller 16.

By correlation of the diagnostic output signal U5 with the control signals U1, U2 of the power switches 3, 4, the following cases of false closure can be detected and distinguished from one another by means of microcontroller 16 in the following way:

a) Short circuit or resistive closure to the supply voltage Vinj including a constantly conducting high-side switch 3: A closure to the supply voltage Vinj or to ground is already detected when there are closed power switches 3, 4, but it cannot be localized. By the method step according to the invention, as the next step the low-side switch 4 is closed for a short time. In the case of a closure to the supply voltage Vinj, the diagnostic voltage Vdiag was at the level of the supply voltage Vinj, but is now drawn to ground. While the diagnostic voltage Vdiag passes through the voltage range between supply voltage Vinj and ground, the diagnostic current Idiag crosses through the window region of the window comparator. At the diagnostic output with the output signal U5 there therefore occurs a short pulse, for which the output signal U5 assumes a passive state.

b) Short circuit or resistive closure to ground, including a constantly conducting low-side switch 4: A closure to the supply voltage Vinj or to ground is already detected when there are closed power switches 3, 4, but it cannot be localized. In the following method step, the low-side switch 4 is closed for a short time. In the case of a closure to ground, the output voltage U5 remains active in an unchanged way.

c) No consumer including a blocked high-side switch 3: After closing of the high-side switch 3, the output signal U5 remains passive.

d) Open low-side switch 4: After activating the low-side switch 4, the output signal U5 remains passive, because the low-side switch 4 is constantly blocked.

e) High-side switch 3 and low-side switch 4 can be switched on an off only together: After closing the high-side switch 3, the output signal U5 becomes active, after additional closing of the low-side switch 4, there does not occur at the diagnostic output any pulse for which the output signal U5 assumes a passive state.

According to FIG. 4, a plurality of electrical consumers 1 can be operated by means of a high-side switch 3 each and a common low-side switch 4. The fault diagnosis is the same as the one described above by means of a diagnostic channel, which is formed by the terminal 7 on the low-side switch 4. The detection and distinction of the fault cases takes place as in the description of the principle, with the following exception: a short circuit or resistive closure to the supply voltage Vinj can indeed be detected, but not assigned to a specific branch comprising electrical consumer 1 and high-side switch 3.

A plurality of groups comprising electrical consumers 1 and high-side switches 3 are operated by means of a low-side switch 4 each. In this case, a diagnostic channel per low-side switch 4 is necessary.

The outputs of the individual window comparators are logically combined with one another in pairs in a way corresponding to FIG. 3 and can be output via the multiplexer 14. The microcontroller 16 then selects for which of the low-side switches 4 the diagnosis is to be carried out by correspondingly activating the multiplexer 14.

The detection and distinction of the fault cases takes place as in the description of the exemplary application according to FIG. 3, with the following exception: a short circuit or resistive closure to the supply voltage Vinj in a group can indeed be detected, but not assigned to a specific branch comprising electrical consumer 1 and assigned high-side switch 3 within the group.

Special precautions for fast diagnosis in the case of capacitive consumers, which may be formed in particular by long cable harnesses with shielded cable and relatively high line capacitances, concern the design of the voltage divider 9 with the resistors R1 and R2.

The time which is required to reach the set diagnostic voltage Vdiag after switching to ground or Vinj is directly proportional to the charge-reversal current and the consumer's load capacitance. For several reasons, the charging-current cannot be increased at will in order to shorten the charge-reversal time. The cable capacitance also cannot be reduced at will. In many application cases, the consumer capacitance for which the charge is to be reversed is increased further for reasons of electromagnetic compatibility.

In order to achieve rapid charge reversal of the capacitances, and consequently a rapid response of the diagnostic circuit, in spite of the problems mentioned above, according to the invention two measures are taken:

1) The diagnostic quiescent voltage Vdiag is increased from 50% Vinj to preferably 90% Vinj. The charge-reversal time from Vinj to the diagnostic voltage is thereby shortened by about 85% (see diagram of FIG. 6).

In order that the charge-reversal time from ground to the diagnostic potential does not increase distinctly, 2) the high-side switch 3 must be activated for a few $\mu s$ before the evaluation of the diagnosis, as a consequence of which the voltage is actively charged to Vinj from any desired potential without additional power drivers (see diagram of FIG. 7), so that subsequently the capacitive components 17 in the form of the cable capacitance can keep being discharged from Vinj by 0.1 Vinj until the diagnostic voltage Vdiag is reached.

Various quiescent potentials are represented at the terminal 7 by the reference numerals 21 and 22 in FIGS. 6 and 7. Reference numeral 23 in FIG. 6 shows a decaying exponential function for an accelerated charge reversal of the capacitive consumer from Vinj by reduction of the voltage difference for which the charge is to be reversed, on the basis of an increased diagnostic voltage (0.9 Vinj).

FIG. 7 shows an accelerated charge reversal of the capacitive consumer, starting from ground potential, by active charge reversal to the potential Vinj.

We claim:

1. A short circuit detection device for an electrical load receiving a load current from a voltage source via a power output stage, the power output stage having at least two power switches and a control device outputting control signals for controlling the power switches, the power switches including a high-side switch and a low-side switch which, together with the load, form a load circuit, the short-circuit detection device comprising:

a measuring device connected in parallel with a load circuit formed by a high-side switch, a load, and a low-side switch, the high-side switch having a first terminal connected to an input of a voltage source and having a second terminal switchably connected to the first terminal of the high-side switch, the low side switch having a first terminal connected to an output ground of the voltage source and a second terminal switchably connected to the first terminal of the low-side switch, said measuring device including a voltage divider with two resistors and a tap between said two resistors, said tap being connected to a terminal selected from the group consisting of the second terminal of the low-side-switch and the second terminal of the high-side switch, and said tap carrying a diagnostic voltage as an output signal of said measuring device, the second reference voltage being at a lower voltage level than a voltage level at the first reference voltage; and a diagnostic device for detecting faults, said diagnostic device including a window comparator connected to receive the diagnostic voltage from said measuring device and two constant reference values.

2. The short-circuit detection device according to claim 1, which further comprises an evaluation device connected to said diagnostic device and a display device connected to said evaluation device, said diagnostic device comparing the diagnostic voltage received from said measurement device with a reference value and outputting at least one output signal for processing in said evaluation device and for forming signals assigned to localized false closures in the load circuit and for display by said display device.

3. The short-circuit detection device according to claim 1, wherein said window comparator is a current-controlled window comparator.

4. The short-circuit detection device according to claim 3, wherein the two constant reference values are current threshold values, and whereby the current threshold values define a window region of said window comparator.

5. The short-circuit detection device according to claim 1, wherein said window comparator is a voltage-controlled window comparator.

6. The short-circuit detection device according to claim 5, wherein the two constant reference values are voltage threshold values, and whereby the voltage threshold values define a window region of said window comparator.

7. The short-circuit detection device according to claim 3, wherein said window comparator includes two comparators having output signals.

8. The short-circuit detection device according to claim 7, wherein the output signals of said two comparators of the window comparator are combined by means of a network which supplies a single output signal defining an output of the diagnostic device.

9. The short-circuit detection device according to claim 1, wherein said control device and said evaluation device are integrated in a microcontroller unit.

10. The short-circuit detection device according to claim 9, wherein a plurality of parallel load circuits each having a high-side switch and an electrical load and having a common low-side switch are connected together.

11. The short-circuit detection device according to claim 1, wherein a plurality of electrical loads are connected in groups of mutually parallel load circuits each having a high-side switch and having a common low-side switch, each of said load circuits having a measuring device and a diagnostic device.

12. The short-circuit detection device according to claim 11, which further comprises a decoder activating the groups of load circuits, and a multiplexer connected to interrogate said diagnostic devices.

13. The short-circuit detection device according to claim 12, wherein said microcontroller outputs a group selection signal to said decoder distinguishing the individual groups from one another, and wherein control signals activating respective said high-side switches are formed by the control signals of said microcontroller via said decoder and the control signals for said low-side switches are formed by means of the control signal fed to the decoder by the microcontroller, and wherein the output signal is fed to the microcontroller from the output signals of the individual groups by means of the group selection signal and said multiplexer.

14. The short-circuit detection device according to claim 3, which further comprises a resistor connected between the diagnostic voltage output of said measuring device and a tap carrying the reference value of said diagnostic device, said resistor conducting a diagnostic current which, depending on a magnitude of the diagnostic voltage relative to the constant reference value may be positive, zero, or negative and have substantially three different forms of state which are digitizable by said window comparator.

15. The short-circuit detection device according to claim 1, wherein a quiescent potential of the diagnostic voltage during a static operation in which said high-side switch and said low-side switch are blocked is adjusted in that said two resistors of the voltage divider are dimensioned such that, for an ohmic or inductive electrical load with substantial capacitive components, a rapid response of said measuring device and said diagnostic device is assured during charge reversal of capacitances, when said power switches are dynamically reactivated.

16. The short-circuit detection device according to claim 15, wherein the quiescent potential of the diagnostic voltage of said measuring device is adjusted to between 0.7 Vinj and 0.9 Vinj, wherein Vinj is a voltage supplied to the ohmic or inductive electrical load.

17. The short-circuit detection device according to claim 16, wherein the quiescent potential of the diagnostic voltage of said measuring device is adjusted to 0.9 Vinj.

18. A method for evaluating short-circuits with the short-circuit detection device according to claim 1, which comprises processing the diagnostic voltage in the diagnostic device and forming at least one output signal taking into account control signals of the high-side switch and of the low-side switch.

19. The method according to claim 18, which comprises controlling the high-side switch and the low-side switch with digital control signals, and first switching only one of the two control signals and then switching the other of the two control signals after a given time delay.

20. The method according to claim 18, which comprises activating the high-side switch for a few $\mu$s before evaluating the output signal in the evaluation device, and thereby actively charging the diagnostic potential to the supply voltage potential from any arbitrary potential without additional power drivers, and subsequently discharging the capacitive components from the supply voltage potential down to the diagnostic voltage.

21. The method according to claim 20, wherein the discharging step comprises discharging the capacitive components by steps of 0.1 supply voltage potential.

22. The short-circuit detection device according to claim 1, wherein the load is selected from the group consisting of ohmic, inductive, and capacitive electrical loads.

23. The short-circuit detection device according to claim 1, wherein the load is a substantially inductive electrical load with ohmic and capacitive components.

24. The short-circuit detection device according to claim 1, wherein the electrical loads are automotive electronic components.

25. The short-circuit detection device according to claim 24, wherein the electrical loads are coils of injection valves in automotive electronics.

* * * * *